(12) United States Patent
Moon et al.

(10) Patent No.: US 7,737,529 B2
(45) Date of Patent: Jun. 15, 2010

(54) PRINTED CIRCUIT BOARD WITH FILM CAPACITOR EMBEDDED THEREIN AND METHOD FOR MANUFACTURING THE SAME

(75) Inventors: Jin Seok Moon, Kyungki-do (KR); Seung Eun Lee, Kyungki-do (KR); Hyung Mi Jung, Kyungki-do (KR); Yul Kyo Chung, Kyungki-do (KR); Seung Hyun Sohn, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 498 days.

(21) Appl. No.: 11/582,954

(22) Filed: Oct. 19, 2006

(65) Prior Publication Data
US 2007/0085166 A1  Apr. 19, 2007

(30) Foreign Application Priority Data
Oct. 19, 2005  (KR) .............. 10-2005-0098498

(51) Int. Cl.
*H01L 29/00* (2006.01)
(52) U.S. Cl. ............. 257/532; 257/295; 257/E27.048
(58) Field of Classification Search .......... 257/310, 257/532, 295, E27.048
See application file for complete search history.

(56) References Cited
U.S. PATENT DOCUMENTS
6,818,469 B2  11/2004 Mori et al.
6,900,498 B2 *  5/2005 Stauf et al. ............ 257/310
2001/0006833 A1  7/2001 Lee et al.
2006/0057420 A1  3/2006 Yokota et al.
2006/0163725 A1 *  7/2006 Haba et al. ............ 257/737
2007/0152773 A1 *  7/2007 Oakes et al. ............ 333/120

FOREIGN PATENT DOCUMENTS
JP  04-285046  10/1992
JP  06-162857  6/1994
JP  2001-223346  8/2001
JP  2005-045099  2/2005
WO  WO 2004/040604 A1  5/2004

OTHER PUBLICATIONS

Japanese Office Action issued in Japanese Patent Application No. JP 2006-285346 dated Feb. 17, 2009.

* cited by examiner

*Primary Examiner*—Thomas L Dickey
*Assistant Examiner*—Fazli Erdem
(74) *Attorney, Agent, or Firm*—McDermott Will & Emery LLP

(57) ABSTRACT

The invention provides a PCB with a thin film capacitor embedded therein and a method for manufacturing the same. The PCB includes a lower electrode formed on an insulating substrate; an amorphous paraelectric film formed on the lower electrode via low temperature film formation; a buffer layer formed on the amorphous paraelectric film; a metal seed layer formed on the buffer layer; and an upper electrode formed on the metal seed layer.

18 Claims, 6 Drawing Sheets

PRINTED CIRCUIT BOARD WITH FILM CAPACITOR EMBEDDED THEREIN AND METHOD FOR MANUFACTURING THE SAME

CLAIM OF PRIORITY

This application claims the benefit of Korean Patent Application No. 2005-98498 filed on Oct. 19, 2005, in the Korean Intellectual Property Office, the disclosure of which is incorporated herein by reference.

BACKGROUND OF THE INVENTION

1. Field of the Invention

The present invention relates to a PCB with a film capacitor embedded therein and a method for manufacturing the same, and more particularly, to a PCB with a thin film capacitor embedded therein, in which a buffer layer is formed between a dielectric layer and an upper electrode to increase the thickness of the upper electrode and the surface roughness of the upper electrode, and a method for manufacturing the same.

2. Description of the Related Art

To date, high-integrity passive devices are demanded more for the purpose of producing high performance electronic units. However, various passive devices mounted on a Printed Circuit Board (PCB) are regarded as a great obstacle in the miniaturization of the electronic units. In particular, as more semiconductor active devices are internally mounted or embedded with their input/output terminals increasing in number, spaces are necessary to provide more passive devices around the embedded active devices. However, such demands are not a problem that can be solved simply.

A capacitor is a representative passive device. Such capacitors are required to be suitably installed to reduce inductance as operating frequency is getting higher. For example, a decoupling capacitor used to stably supply electric power is required to be arranged most adjacent to an input terminal in order to reduce inductance according to high frequency.

To meet such miniaturization and high frequency demands, various types of low equivalent series inductance (ESL) multilayer capacitors have been developed. However, since conventional Multi-Layer Cofired Ceramic (MLCC) capacitors are discrete devices, it is essentially difficult to overcome such problems. Since such capacitors are generally used as devices of an electric circuit, it is possible to effectively reduce the size of an electric circuit board only if the capacitors can be embedded in the electric circuit board. On this point of view, recently active studies are being made to realize embedded capacitors.

The embedded capacitors can be used in a memory card, a PC motherboard and various RF modules to remarkably reduce product size. In addition, it is possible to arrange the embedded capacitors in the vicinity of input terminals of active devices, thereby minimizing conductor length and reducing inductance remarkably. In the embedded capacitors, however, poor heterogeneous bonding makes it difficult to obtain thick electrodes. That is, at a dielectric layer with a thickness of 1.0 μm or less and upper and lower electrodes each with a thickness of 1.0 μm, bonding may be enabled up to a certain degree. However, with the upper and lower electrodes thicker than the former value, residual strain of a metal layer causes the metal layer to peel off from a dielectric layer. This is a problem taking place because ceramics and metals have different crystal structures.

A conventional approach to solve the foregoing problems of the embedded capacitor was disclosed by U.S. Pat. No. 6,818,469. According to this conventional technology, referring to FIG. 1, a PCB 10 with a film capacitor embedded therein includes an insulating substrate 11a, a lower electrode 13 formed on the insulating substrate 11a, a dielectric film 15 formed on the lower electrode 13 and an upper electrode formed on the dielectric film 15. However, since the conventional technology employs Physical Vapor Deposition (PVD) such as sputtering and E-beam to form the upper and lower electrodes, it costs high to make the electrodes thick. Furthermore, electrodes produced by PVD typically have a surface roughness at most 100 nm, and thus the insulating substrate 11b peels off from the upper electrode in the following process if the substrate 11b is compressively stacked on the upper electrode 17.

SUMMARY OF THE INVENTION

The present invention has been made to solve the foregoing problems of the prior art and therefore an object of certain embodiments of the present invention is to provide a PCB with a thin film capacitor embedded therein, in which a buffer layer is formed between a dielectric layer and an upper electrode to increase the thickness of the upper electrode and the surface roughness of the upper electrode, thereby enhancing bonding force between the upper electrode and an overlying substrate, and a method for manufacturing the same.

According to an aspect of the invention for realizing any of the above objects, the invention provides a PCB with a film capacitor embedded therein. The PCB includes a lower electrode formed on an insulating substrate; an amorphous paraelectric film formed on the lower electrode via low temperature film formation; a buffer layer formed on the amorphous paraelectric film; a metal seed layer formed on the buffer layer; and an upper electrode formed on the metal seed layer.

According to another aspect of the invention for realizing any of the above objects, the invention provides a method for manufacturing a PCB with a film capacitor embedded therein. The method includes steps: forming a lower electrode on an insulating substrate; forming an amorphous paraelectric film on the lower electrode via low temperature film formation of up to 200° C. forming a buffer layer on the amorphous paraelectric film; forming a metal seed layer on the buffer layer; and forming an upper electrode on the metal seed layer.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

A PCB of the invention will now be described in detail with reference to the accompanying drawings.

Figure 2:
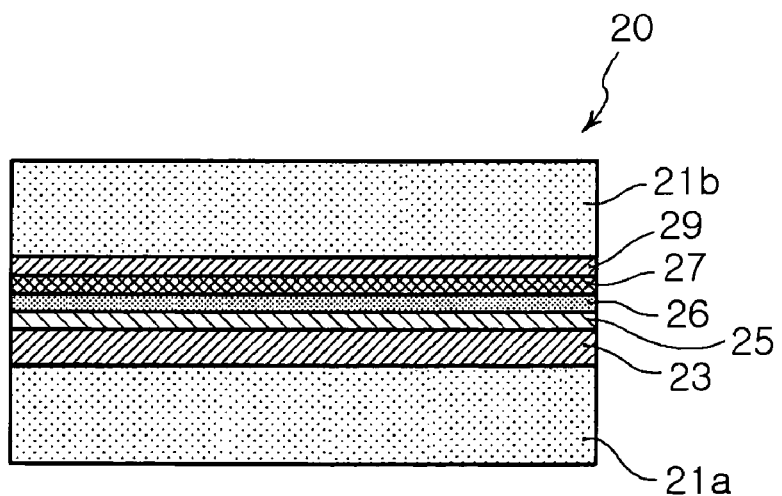
FIG. 2 is a cross-sectional view illustrating a PCB with a film capacitor embedded therein according to an embodiment of the invention.

FIG. 2 is a cross-sectional view illustrating a PCB 20 with a film capacitor embedded therein according to an embodiment of the invention. Referring to FIG. 2 the PCB 20 of the invention has a multilayer structure including an insulating substrate 21a, a lower electrode 23, a buffer layer 26, a metal seed layer 27, an upper electrode 29 and an insulating substrate 21b which are sequentially layered one on another.

Figure 3:
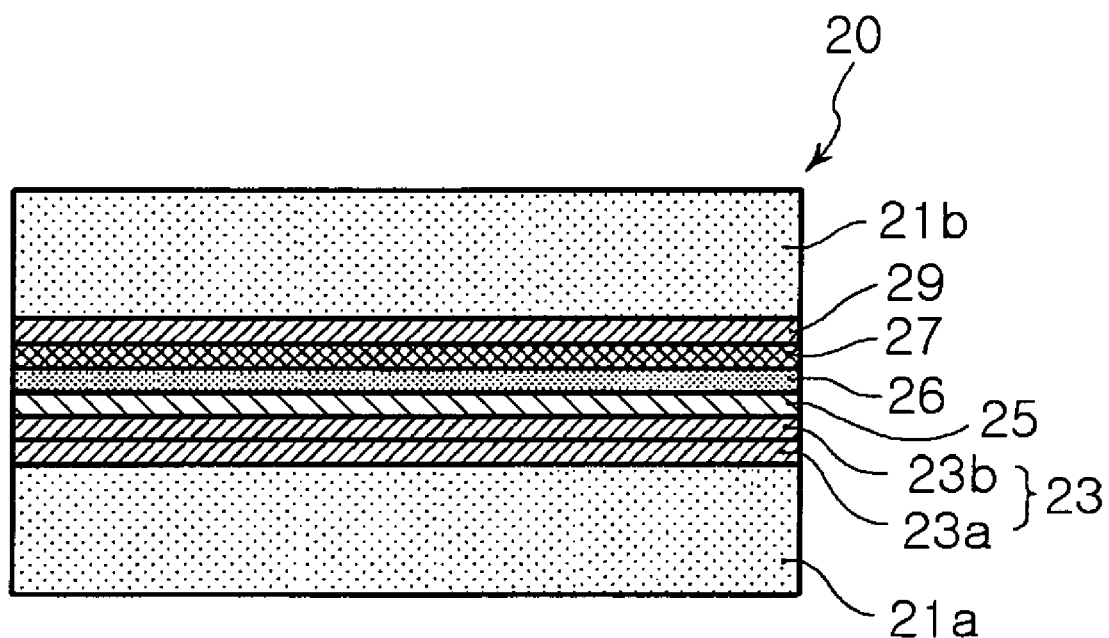
FIG. 3 is a cross-sectional view illustrating a PCB with a film capacitor embedded therein according to another embodiment of the invention.

FIG. 3 is a cross-sectional view illustrating a PCB 20 with a film capacitor embedded therein according to another embodiment of the invention. Referring to FIG. 3, the PCB 20 has a multilayer structure including an insulating substrate 21a, a first lower electrode 23a, a second lower electrode 23b, an amorphous paraelectric film 25, a buffer layer 26, a metal seed layer 27, an upper electrode 29 and an insulating substrate 21b which are sequentially layered one on another.

The insulating substrates 21a and 21b are not specifically limited but may utilize polyimide or epoxy widely used for PCBs.

The lower electrode 23; 23a, 23b is preferably made of a metal selected from the group consisting of Cu, Ni, Al, Pt, Ta and Ag. More preferably, the lower electrode is made of Cu. As proposed in another embodiment of the invention as shown in FIG. 3, the lower electrode may include the first lower electrode 23a on the insulating substrate 21a and the second lower electrode 23b on the first lower electrode 23a, which are formed distinctively from each other. Preferably, the first lower electrode is formed via electroless plating, and the second lower is formed via electrolytic plating. More preferably, the first lower electrode has a thickness of 1.0 μm or less, and the second lower electrode has a thickness of 1.0 μm to 9.0 μm.

Furthermore, the amorphous paraelectric film 25 is made of preferably BiZnNb based metal oxide, and more preferably $Bi_xZn_yNb_zO_7$ metal oxide, where $1.3 \leq x \leq 2.0$, $0.8 \leq y \leq 1.5$ and $z \leq 1.6$. The dielectric film made of such amorphous metal oxide may have high dielectric constant of at least 30, and more particularly, at least 40. More preferably, the amorphous paraelectric film has a thickness of 2.0 μm or less.

The buffer layer 26, a key element of the invention, serves to increase the thickness of the electrodes and the surface roughness of the upper electrode to enhance bonding force with the overlying insulating substrate, ensure enhanced bonding force with the underlying amorphous paraelectric film 25, and prevent migration of metal atoms of the upper electrode.

The buffer layer 26 is preferably made of Ti or Cr. More preferably, the buffer layer 26 has a thickness of 1.0 μm or less. The buffer layer 26 is preferably formed via PVD since it can improve bonding force with the amorphous paraelectric film 25.

The metal seed layer 27 is made preferably of a metal selected from the group consisting of Cu, Ni, Ti, Au, Co, Ag, Pt and Pd with a thickness of 1.0 μm or less. More preferably, the metal seed layer 27 is formed via electroless plating.

The upper electrode 29 preferably has a surface roughness of 300 nm or more. The upper electrode may be made of a metal selected from the group consisting of Cu, Ni, Al, Pt, Ta and Ag, and more preferably of Cu. Considering one of the objects of the invention, that is, to produce a thick electrode, the upper electrode preferably has a thickness of 1.0 μm or more. More preferably, the upper electrode is formed via electrolytic plating.

Next a method of manufacturing a PCB with a film capacitor embedded therein of the invention will be described step-by-step with reference to the accompanying drawings.

Figure 4:
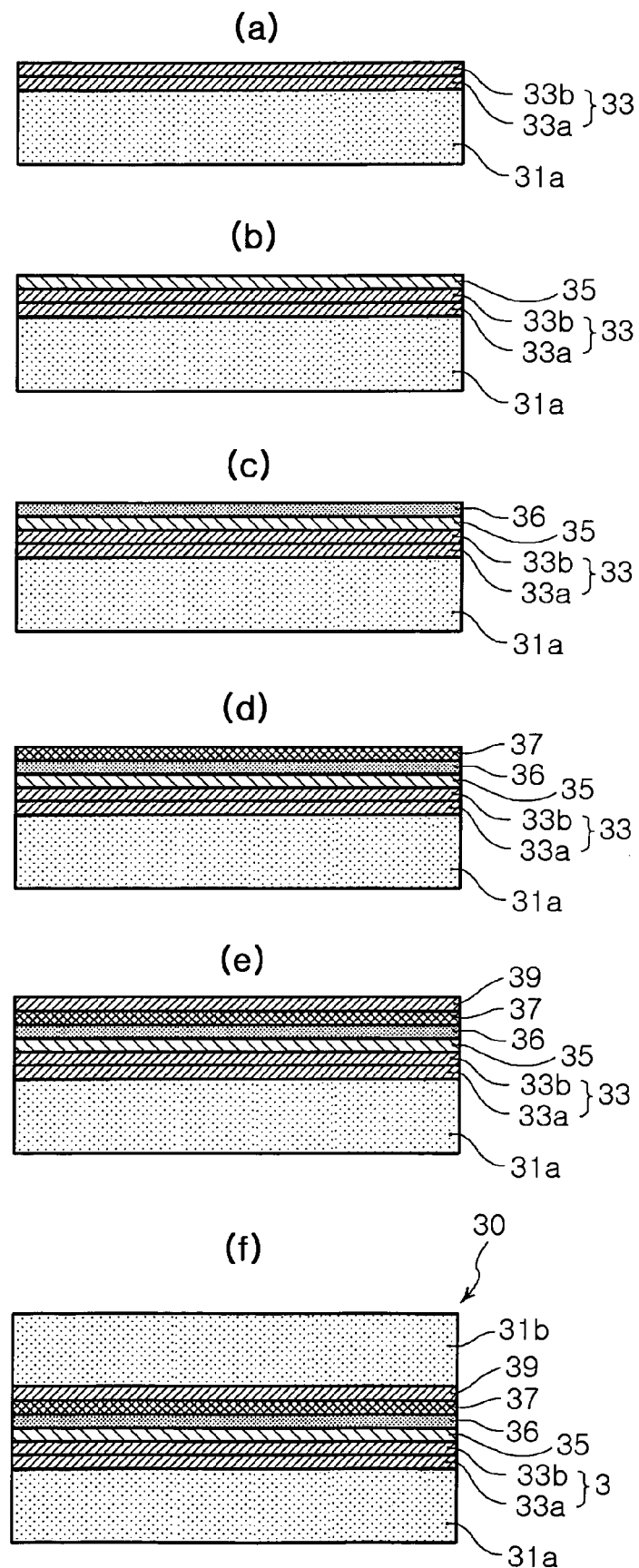
FIG. 4 is a cross-sectional view illustrating a process of manufacturing a PCB according to the invention.

FIG. 4 is a cross-sectional view illustrating a process of manufacturing a PCB according to the invention.

According to this embodiment, a lower electrode 33 is first formed on an insulating substrate 31a as shown in FIG. 4(a). According to another embodiment of the invention, the lower electrode is produced by forming a first lower electrode 33a on the insulating substrate 31a and then a second lower electrode 33b on the first lower electrode 33a. Considering the insulating substrate 31a is polymer vulnerable to heat, the lower electrode is preferably made via low temperature film formation such as low temperature sputtering, evaporation, electroless plating and electrolytic plating. As suggested in another embodiment of the invention, in formation of the lower electrode including the first and second lower electrodes, it is preferable that the first lower electrode is made by electroless plating and the second lower electrode is formed by electrolytic plating. Preferably, the first lower electrode is formed to have a thickness of 1.0 μm or less, and the second lower electrode is formed to have a thickness of 1.0 μm to 9.0 μm. In addition, the lower electrode 33; 33a, 33b is preferably made of a metal selected from the group consisting of Cu, Ni, Al, Pt, Ta and Ag, and more preferably, of Cu.

Then, as shown in FIG. 4(b), an amorphous paraelectric film 35 is formed on the lower electrode 33; 33a, 33b formed as above. The dielectric film is preferably made of low temperature film formation of 200° C. or less. Examples of the low temperature film formation may include sputtering, PLD and CVD. The dielectric layer 35 produced by the low temperature formation is amorphous metal oxide, which has a sufficient level of dielectric constant and thus does not need subsequent high temperature heat treatment for crystallization to follow. Preferably, the amorphous paraelectric film 35 is made of BiZnNb amorphous metal oxide, and more preferably, of $Bi_xZn_yNb_zO_7$ metal oxide, where $1.3 \leq x \leq 2.0$, $0.8 \leq y \leq 1.5$ and $z \leq 1.6$. The dielectric film made of such amorphous metal oxide may have high dielectric constant of at least 30, and more particularly, at least 40. More preferably, the amorphous paraelectric film has a thickness of 2.0 μm or less.

Then, as shown in FIG. 4(c), a buffer layer 36 is formed on the amorphous paraelectric film 35. The buffer layer 36 is preferably formed via PVD such as sputtering and E-beam. In addition, the buffer layer is preferably made of Ti or Cr, with a thickness limited to 1.0 μm or less in view of manufacturing cost and the like.

The buffer layer 36 is a key element of the invention, and can increase the thickness of the electrodes and the surface roughness of the upper electrode to enhance bonding force with the overlying insulating substrate, ensure enhanced bonding force with the underlying amorphous paraelectric film 35, and prevent migration of metal atoms of the upper electrode.

Next, as shown in FIG. 4(d), a metal seed layer 37 is formed on the buffer layer 36. Preferably, the metal seed layer 37 is formed via electroless plating. The electroless plating is not specifically limited. In case of Cu electroless plating, an electroless plating bath can contain Cu ions, EDTA, NaOH, formaldehyde and the like. When pH of the plating bath is raised to 11 or more by controlling the input of NaOH, strong reduction takes place in formaldehyde to generate electrons, which then flow to Cu ions so that Cu can be plated on the buffer layer 26. The metal seed layer 37 is made preferably of a metal selected from the group consisting of Cu, Ni, Ti, Au, Co, Ag, Pt and Pd, and preferably with a thickness limited to 1.0 μm or less.

Then, as shown in FIG. 4(e), an upper electrode 39 is formed on the metal seed 37. The upper electrode is formed preferably via electrolytic plating to have surface roughness Ra of 300 nm or more. To produce an electrolytic plating layer having desired surface roughness, current density and plating time of electrolytic plating are preferably optimized. For example, the current density may be set 1.0 A/dm$^2$ to 3.0 A/dm$_2$ and the plating time may be set 5 minutes or more. Furthermore, the upper electrode may be made of a metal selected from the group consisting of Cu, Ni, Al, Pt, Ta and Ag, and more preferably of Cu. Considering one of the objects of the invention, that is, to produce a thick electrode, the upper electrode is formed preferably with a thickness of 1.0 μm or more.

After that, as shown in FIG. 4(f), an insulating substrate 31b is stacked on the upper electrode 39 and the resultant multilayer structure is pressed via typical process so as to manufacture a PCB with a film capacitor embedded therein.

As set forth above, the invention can efficiently manufacture the PCB with a film capacitor embedded therein by sequentially forming the film capacitor on an insulating substrate and then performing a typical build-up process for PCB.

Furthermore, it is possible to prevent peeling between the upper electrode and the insulating substrate, which takes place in conventional film capacitors, thereby to promote product reliability.

The present invention will now be described in more detail with reference to following examples. However, it should be construed that the followings examples are provided herein for purposes of illustration only and are not intended to be limiting unless otherwise specified.

EXAMPLES

Inventive Example

A PCB having a structure of FIG. 3 was manufactured according to the process of FIG. 4. That is, a first lower electrode was formed by plating Cu at a thickness of 1.0 μm on an epoxy-based insulating substrate via electroless plating, and a second lower electrode was formed by plating Cu at a thickness of 1.0 μm on the first lower electrode. The electrolytic plating was performed according to following conditions: current density of 1.2 A/dm$^2$, plating time of 5 minutes, plating solution concentration of CuSO$_4$.5H$_2$O: 200 g/l, H$_2$SO$_4$: 30 g/l, Cl$^-$: 40 ppm or less, leveler: 20 ml/l and brightener: 0.5 ml/l. Then, an amorphous paraelectric film Bi$_{1.5}$ZnNb$_{1.5}$O$_7$ was formed at a thickness of 0.3 μm by using low temperature film formation of 200° C. or less. The paraelectric film was formed via sputtering at deposition pressure of 200 mTorr or less, temperature 200° C. or less and deposition time of 3 hours or less. After the sputtering, a Ti buffer layer was formed at a thickness of 0.2 μm or less on the amorphous paraelectric film via sputtering according to following conditions: deposition pressure of 1.5 mTorr or less, temperature of 200° C. or less, deposition time of 1 hour or less and Ar gas atmosphere. Then, Cu was electrolessly plated at a thickness of 0.2 μm on the Ti buffer layer. Next, Cu was electrolytically plated at a thickness of 1.0 μm on the Cu seed layer. The electrolytic plating was performed according to following conditions: current density of 1.2 A/dM$^2$, plating time of 5 minutes, plating solution concentration of CuSO$_4$.5H$_2$O: 200 g/l, H$_2$SO$_4$: 30 g/l, Cl$_-$: 40 ppm or less, leveler: 20 ml/l and brightener: 0.5 ml/l.

The surface roughness Ra of the upper electrode of the PCB manufactured as above was measured for five times, and results are reported in Table 1 below.

TABLE 1

| No. | Ra (nm) |
|---|---|
| 1st | 334 |
| 2nd | 321 |
| 3rd | 319 |
| 4th | 306 |
| 5th | 324 |
| Ave. | 320 |

Figure 5:
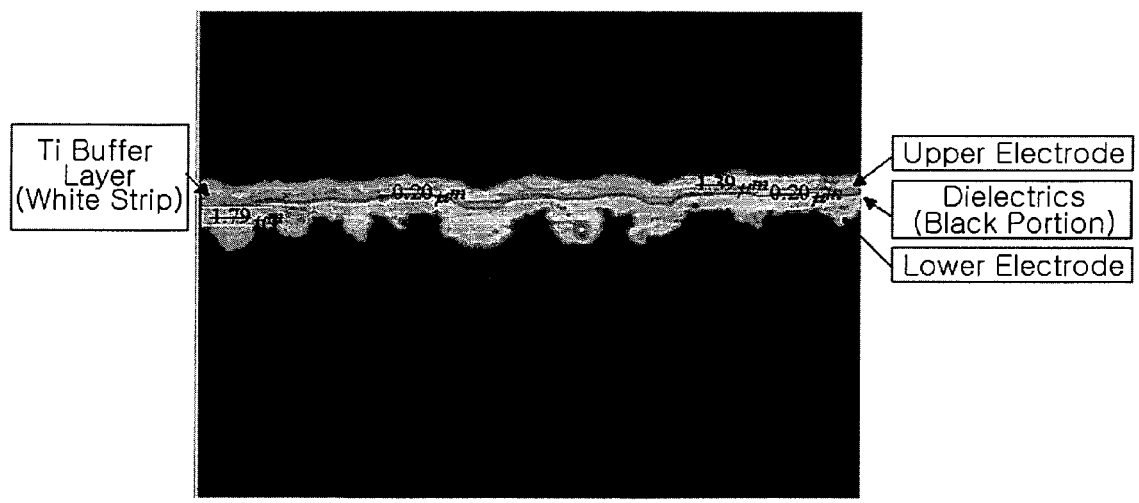
FIG. 5 is an optical microscope photograph illustrating a cross section of a PCB according to the invention.
Figure 6:
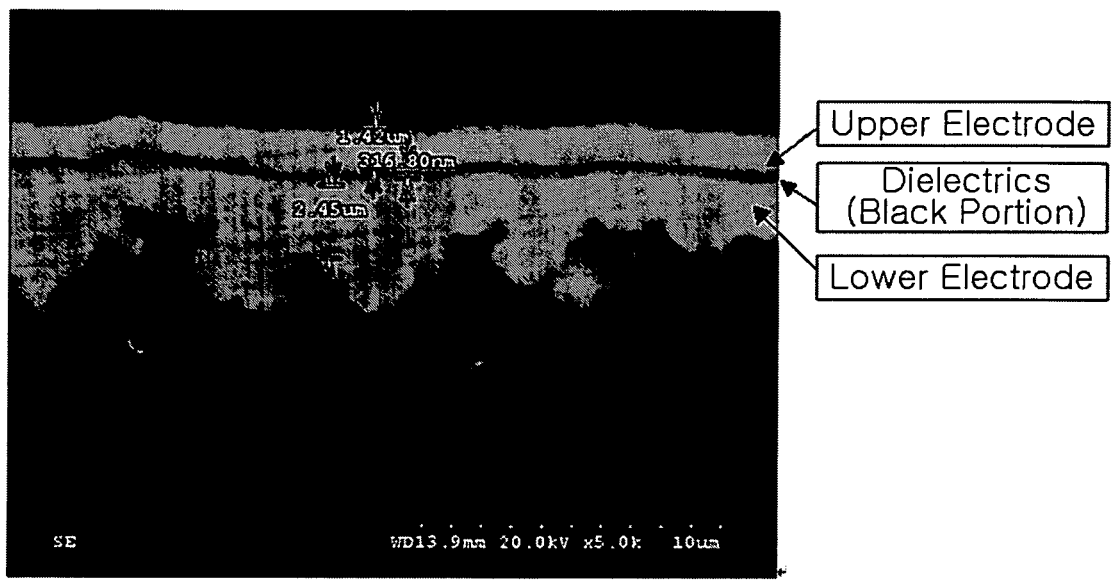
FIG. 6 is an electron microscope photograph illustrating a cross section of a PCB according to the invention.

As seen in Table 1 above, the upper electrode of the PCB manufactured according to the invention had an average surface roughness of 320 nm, which indicates excellent bonding force with the overlying insulating substrate (see FIGS. 5 and 6).

Furthermore, the PCB manufactured as above had a thickness (from the lower electrode to the upper electrode) of about 4.19 μm.

Comparative Example

Figure 1:
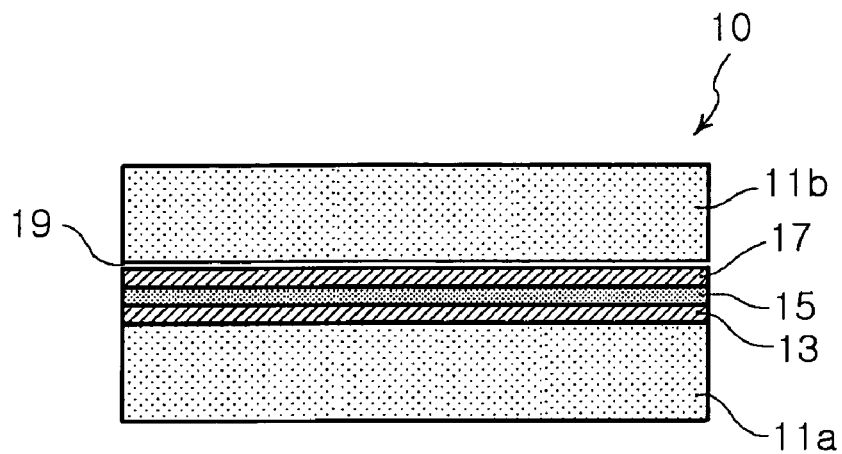
FIG. 1 is a cross-sectional view illustrating a conventional PCB with a film capacitor embedded therein.

A PCB having a structure of FIG. 1 was manufactured by using a conventional process. That is, a Cu lower electrode was formed on an epoxy-based insulating substrate via PVD, and an amorphous paraelectric film of Bi$_{1.5}$ZnNb$_{1.5}$O$_7$ was formed at a thickness of 0.3 μm on the lower electrode. Then, a Cu upper electrode was formed at a thickness of 1.0 μm on the amorphous paraelectric film via sputtering.

The surface roughness Ra of the upper electrode of the PCB manufactured as above was measured for five times, and results are reported in Table 2 below.

TABLE 2

| No. | Ra (nm) |
|---|---|
| 1st | 101 |
| 2nd | 123 |
| 3rd | 125 |
| 4th | 116 |
| 5th | 110 |
| Ave. | 115 |

Figure 7:
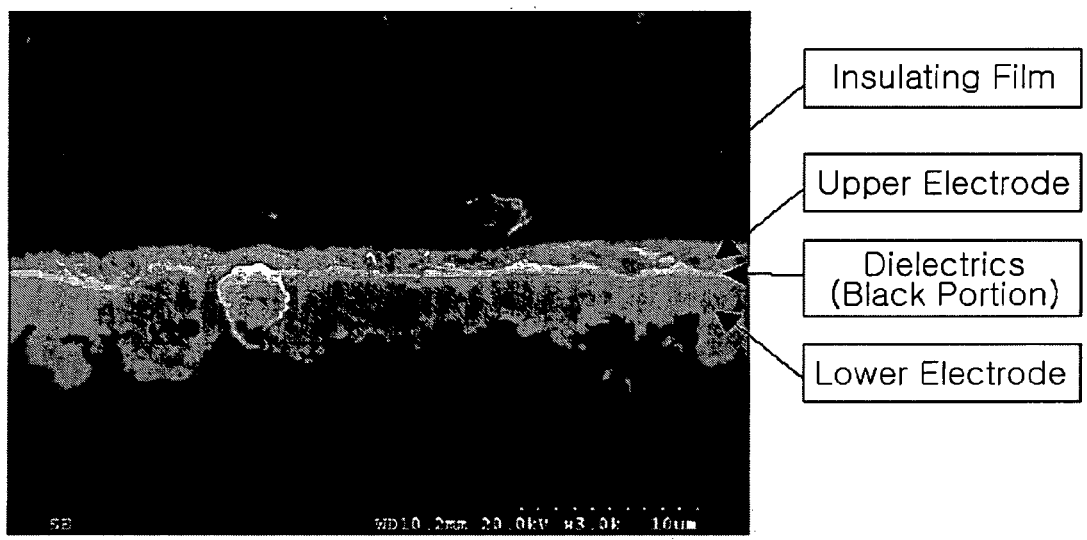
FIG. 7 is an electron microscope photograph illustrating a cross section of a PCB according to a comparative example.

As seen in Table 2 above, the upper electrode of the PCB manufactured according to the conventional process has an average surface roughness of 115 nm, which indicates bonding force with the overlying insulating substrate remarkably inferior to that of Inventive Example (see FIG. 7).

In addition, the PCB manufactured as above had a thickness (from the lower electrode to the upper electrode) of about 2.3 μm.

According to the PCB with a film capacitor embedded therein of the present invention as set forth above, a buffer layer is formed between a dielectric layer and an upper electrode, which can increase the thickness of the electrode and the surface roughness of the upper electrode, thereby enhancing bonding force with the upper substrate and ensuring product reliability.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

What is claimed is:

1. A printed circuit board with a film capacitor embedded therein, comprising:
   a lower electrode formed on a first insulating substrate;
   an amorphous paraelectric film formed on the lower electrode via low temperature film formation;
   a buffer layer formed on the amorphous paraelectric film;
   a metal seed layer formed on the buffer layer;
   an upper electrode formed on the metal seed layer and having a surface roughness (Ra) of more than 300 nm; and
   a second insulating substrate formed on the upper electrode.

2. The printed circuit board according to claim 1, wherein the lower electrode comprises a first lower electrode formed on the insulating substrate and a second lower electrode formed on the first lower electrode, the first lower electrode formed via electroless plating, and the second lower electrode formed via electrolytic plating.

3. The printed circuit board according to claim 1, wherein the lower electrode comprises a first lower electrode formed on the insulating substrate and a second lower electrode formed on the first lower electrode, the first lower electrode having a thickness up to 1.0 µm, the second lower electrode having a thickness of 1.0 µm to 9.0 µm.

4. The printed circuit board according to claim 1, wherein the lower electrode comprises a metal selected from a group consisting of Cu, Ni, Al, Pt, Ta and Ag.

5. The printed circuit board according to claim 4, wherein the lower electrode comprises Cu.

6. The printed circuit board according to claim 1, wherein the amorphous paraelectric film comprises a dielectric film of BiZnNb based metal oxide.

7. The printed circuit board according to claim 6, wherein the BiZnNb based metal oxide comprises a composition of $Bi_xZn_yNb_zO_7$, where $1.3 \leq x \leq 2.0$, $0.8 \leq y \leq 1.5$ and $z \leq 1.6$.

8. The printed circuit board according to claim 1, wherein the amorphous paraelectric film has a thickness up to 2.0 µm.

9. The printed circuit board according to claim 1, wherein the buffer layer comprises Ti or Cr.

10. The printed circuit board according to claim 1, wherein the buffer layer has a thickness up to 1.0 µm.

11. The printed circuit board according to claim 1, wherein the buffer layer is formed via physical vapor deposition.

12. The printed circuit board according to claim 1, wherein the metal seed layer comprises a metal selected from a group consisting of Cu, Ni, Ti, Au, Co, Ag, Pt and Pd.

13. The printed circuit board according to claim 1, wherein the metal seed layer has a thickness up to 1.0 µm.

14. The printed circuit board according to claim 1, wherein the metal seed layer is formed via electroless plating.

15. The printed circuit board according to claim 1, wherein the upper electrode comprises a metal selected from a group consisting of Cu, Ni, Al, Pt, Ta and Ag.

16. The printed circuit board according to claim 15, wherein the upper electrode comprises Cu.

17. The printed circuit board according to claim 1, wherein the upper electrode has a thickness of at least 1.0 µm.

18. The printed circuit board according to claim 1, wherein the upper electrode is formed via electrolytic plating.

* * * * *